(12) United States Patent
Tamura et al.

(10) Patent No.: US 7,054,990 B1
(45) Date of Patent: May 30, 2006

(54) EXTERNAL STORAGE DEVICE USING NON-VOLATILE SEMICONDUCTOR MEMORY

(75) Inventors: Takayuki Tamura, Kawasaki (JP); Jun Kitahara, Kawasaki (JP); Toru Owada, Kawasaki (JP); Shinichi Sawamura, Kawasaki (JP); Takeshi Asahi, Kawasaki (JP); Nagamasa Mizushima, Kawasaki (JP); Takashi Totsuka, Kodaira (JP); Yasushi Akao, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 508 days.

(21) Appl. No.: 09/635,217

(22) Filed: Aug. 10, 2000

(30) Foreign Application Priority Data

Aug. 11, 1999 (JP) ............................................ 11-227209

(51) Int. Cl.
*G06F 12/00* (2006.01)

(52) U.S. Cl. ........................ 711/103; 711/112; 711/173; 711/154; 711/163; 713/100

(58) Field of Classification Search ................. 711/103, 711/111, 112, 152, 153, 154, 163, 164, 173, 711/170, 157; 713/2, 151, 100
See application file for complete search history.

(56) References Cited

U.S. PATENT DOCUMENTS

| | | | | |
|---|---|---|---|---|
| 5,491,827 A | * | 2/1996 | Holtey ........................ | 711/163 |
| 5,719,387 A | | 2/1998 | Fujioka | |
| 5,875,465 A | * | 2/1999 | Kilpatrick et al. .......... | 711/134 |
| 5,881,002 A | | 3/1999 | Hamakawa | |
| 5,930,826 A | * | 7/1999 | Lee et al. .................... | 711/103 |
| 6,009,495 A | * | 12/1999 | DeRoo et al. ............... | 711/103 |
| 6,026,016 A | * | 2/2000 | Gafken .................... | 365/185.04 |
| 6,092,161 A | * | 7/2000 | White et al. ................. | 711/163 |
| 6,281,894 B1 | * | 8/2001 | Rive ........................... | 345/705 |
| 6,480,932 B1 | * | 11/2002 | Vallis et al. ................. | 711/112 |
| 6,633,976 B1 | * | 10/2003 | Stevens .......................... | 713/2 |
| 6,662,286 B1 | * | 12/2003 | Kusakabe et al. .......... | 711/170 |
| 6,728,830 B1 | * | 4/2004 | Assaf .......................... | 711/112 |
| 6,868,496 B1 | * | 3/2005 | Sales et al. ................. | 713/200 |

FOREIGN PATENT DOCUMENTS

| | | | |
|---|---|---|---|
| JP | 62-637548 | | 10/1987 |
| JP | 02053154 | * | 2/1990 |
| JP | 2-129784 | | 5/1990 |
| JP | 527924 | | 2/1993 |
| JP | 08-203292 | | 8/1996 |
| JP | 08-272925 | | 10/1996 |
| WO | 11-110293 | | 4/1999 |

* cited by examiner

*Primary Examiner*—Pierre Bataille
(74) *Attorney, Agent, or Firm*—Antonelli, Terry, Stout and Kraus, LLP.

(57) ABSTRACT

The external storage device according to the present invention which uses a non-volatile semiconductor memory such as a flash memory is provided with plural areas which store user data, and restricts access to the user data from a host computer and also dynamically changes an area an access to which is to be restricted. Accordingly, the ease of use of the external storage device for the host computer is improved. Specifically, the interior of the flash memory is divided into a normal area not protected by a password or the like and a protected area protected by a password or the like. A microprocessor controls accesses to the normal area and the protected area in accordance with a command from the host computer. In addition, the host computer can access the protected area after passing through authentication using a password. Moreover, the host computer changes information indicative of the location of the protected area, thereby dynamically changing the protection area.

21 Claims, 14 Drawing Sheets

CONSTRUCTION OF FLASH MEMORY

SYSTEM OUTLINE

CONSTRUCTION OF FLASH MEMORY

COMMAND PROCEDURE

COMMAND PROCEDURE (CONTINUED FROM FIG. 4)

COMMAND PROCESSING (CONTINUED FROM FIG. 5)

COMMAND PROCESSING (CONTINUED FROM FIG. 6)

POWER-ON PROCEDURE IN ANOTHER EMBODIMENT

READ COMMAND PROCEDURE IN ANOTHER EMBODIMENT

EXTERNAL STORAGE DEVICE USING NON-VOLATILE SEMICONDUCTOR MEMORY

BACKGROUND OF THE INVENTION

The present invention relates to an external storage device using a non-volatile semiconductor memory and, more particularly, to access control on the non-volatile semiconductor memory.

As an external storage device using a non-volatile semiconductor memory, there is an external storage device using a flash memory. An example of the external storage device using a flash memory is described in Japanese Patent Laid-Open No. 27924/1993, "EXTERNAL STORAGE SYSTEM USING SEMICONDUCTOR MEMORY AND CONTROL METHOD FOR THE SAME". In the external storage device using a flash memory, sector data is written to an area accessible to the user of the flash memory (hereinafter referred to as the user data area) in accordance with a write command issued by a host computer. In addition, the sector data stored in the user data area is read in accordance with a read command issued by the host computer. The writing and the reading of the sector data are performed for the entire user data area.

In the standard "ANSI X3.279-1996 AT Attachment Interface with Extensions", access to user data is restricted by a security function using a password.

The above related arts provide the security of access to the whole of the user data area, but do not restrict access to individual sector data stored in the user data area. In addition, the related arts provide protection for the whole of the user data area, but do not take account of protection for a specified area of the user data area.

If no protection for a specified area of the user data area is provided, in a host computer using an external storage device, all user data areas are protected or are not protected, therefore the ease of use of the external storage device is degraded. In addition, protection for all user data areas imposes restrictions on a protection method for user data in the host computer, and such a restriction becomes a problem to the degree of freedom of the system design of the host computer and the external storage device.

SUMMARY OF THE INVENTION

An object of the present invention is to provide data protection for a user data area specified by a host computer, in an external storage device. Furthermore, an object of the present invention is to provide a protection function for a specified area in a user data area.

Another object of the present invention is to improve the ease of use of an external storage device for a host computer by dynamically switching a protected user data area and a non-protected user data area.

To achieve the above objects, in an external storage device according to the present invention, the user data area of a non-volatile semiconductor memory is divided into plural areas. The external storage device assigns different commands to the reading, writing and erasing of each of the divided user data areas by the host computer. Accordingly, the external storage device can control access to the plural areas of the non-volatile semiconductor memory by the host computer, in accordance with a command issued by the host computer.

In addition, the external storage device is provided with an authentication procedure using a password. By using this authentication procedure, the plural divided areas of the non-volatile semiconductor memory are divided into a protected area, which is protected by the authentication procedure, and a non-protected area, which is not protected by a the authentication procedure. Since the host computer can access the non-protected area normally, without passing through the authentication procedure, this non-protected area is called a normal area. By providing the protected area and the normal area, it is possible to restrict access to the user data area by the host computer. Accordingly, it is possible to provide a protection function capable of protecting a specified area in the user data area.

Moreover, instead of fixing the protected area, it is possible to dynamically change the sizes of the protected area and the normal area by storing protected-area information in the external storage device and by enabling changing of the information by the host computer. Since the size of the protected area can arbitrarily be changed by the host computer, the ease of use of the external storage device for the host computer is improved.

BRIEF DESCRIPTION OF THE DRAWINGS

Preferred embodiments of the present invention will be described below in detail with reference to the accompanying drawings, wherein.

DESCRIPTION OF THE PREFERRED EMBODIMENTS

Preferred embodiments of the external storage device using a non-volatile semiconductor memory according to the present invention will be described below.

First of all, the outline of a system using the external storage device according to the present invention will be described below with reference to FIG. 1.

Figure 1:
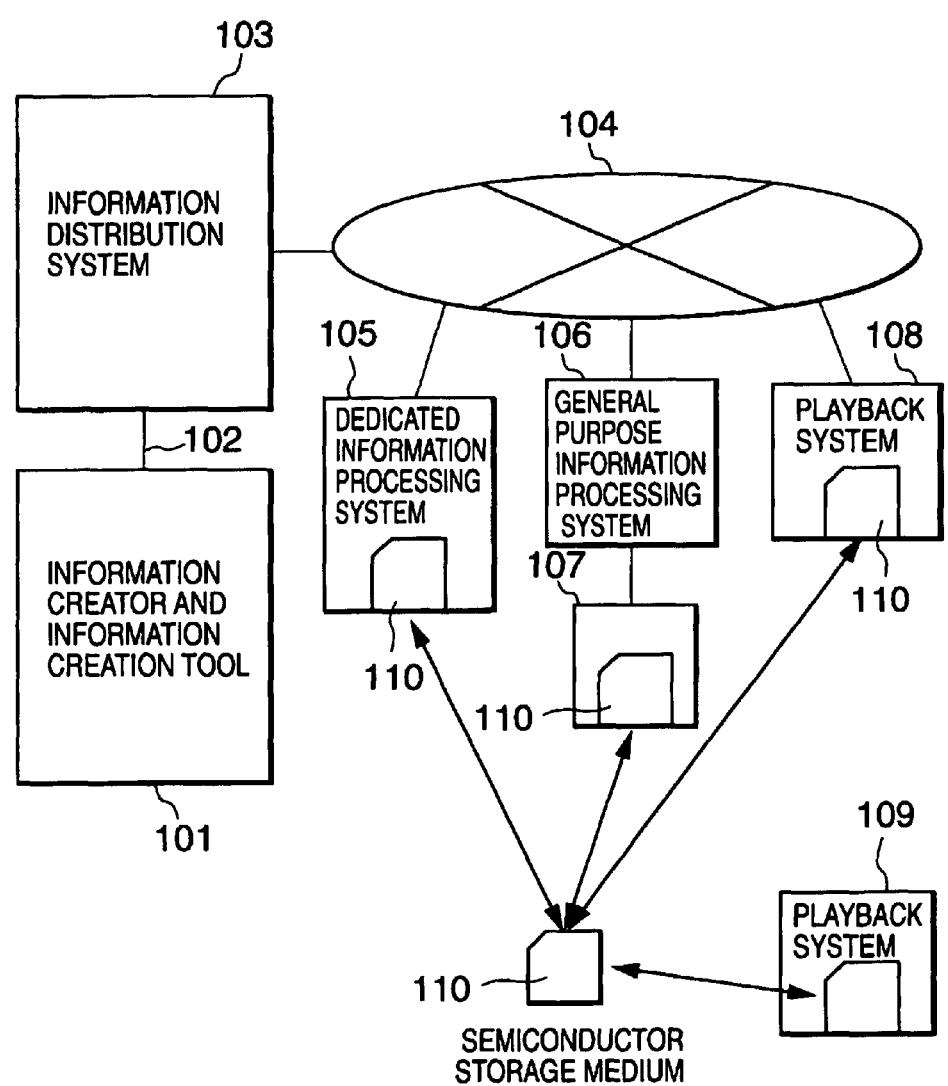
FIG. 1 shows one example of a system using the external storage device according to the present invention.

The system shown in FIG. 1 includes an information creator and an information creation tool 101 that create information, an information distribution system 103 connected to the information creation tool 101 via a transfer part 102, at least one dedicated terminal (information processing system) 105 connected to the information distribution system 103 by a communication network 104, at least one semiconductor storage medium (non-volatile semiconductor memory) 110, and at least one information playback system 109. In addition to the dedicated terminal 105, there may also exist an information playback system 108, which is connectable to the communication network 104, and a general purpose information processing system 106, such as a personal computer, which is connectable to the communication network 104 and is provided with a semiconductor storage medium access part 107.

Information is created with the information creation tool 101, and is stored in the information distribution system 103. At this time, the information is transferred by means of the communication line or via a magnetic storage medium such as a floppy disk. The information distribution system 103 processes the information stored in the information distribution system 103 or adds additional information to the information stored in the information distribution system 103, in accordance with a request from the dedicated terminal 105, the general purpose information processing system 106 or the information playback system 108, and transfers the obtained information to each of the dedicated terminal 105, the general purpose information processing system 106 and the information playback system 108 via the communication network 104.

The dedicated terminal 105, the general purpose information processing system 106 or the information playback system 108 to which the information has been transferred transfer the information to the semiconductor storage medium 110 connected to itself. Plural kinds of information may also be stored in the dedicated terminal 105 so that processing of information and addition of additional information may be performed at the dedicated terminal 105. The general purpose information processing system 106 and the information playback system 108 transfer the information, which has been transferred from the information distribution system 103, to the respective semiconductor storage media 110 basically on an as-received basis. At this time, information exchange for mutual recognition and mutual validity decision is carried out between the information distribution system 103 and the dedicated terminal 105, between the dedicated terminal 105 and the semiconductor storage medium 110, and between the information distribution system 103 and the semiconductor storage medium 110.

The semiconductor storage medium 110 which stores the distributed information which has been processed or to which the additional information has been added is connected to the information playback system 109, and transfers the stored information to the information playback system 109 in accordance with a request from the information playback system 109. At this time, the semiconductor storage medium 110 and the information playback system 109 carry out information exchange for recognizing each other and mutually determining their validity.

Figure 2:
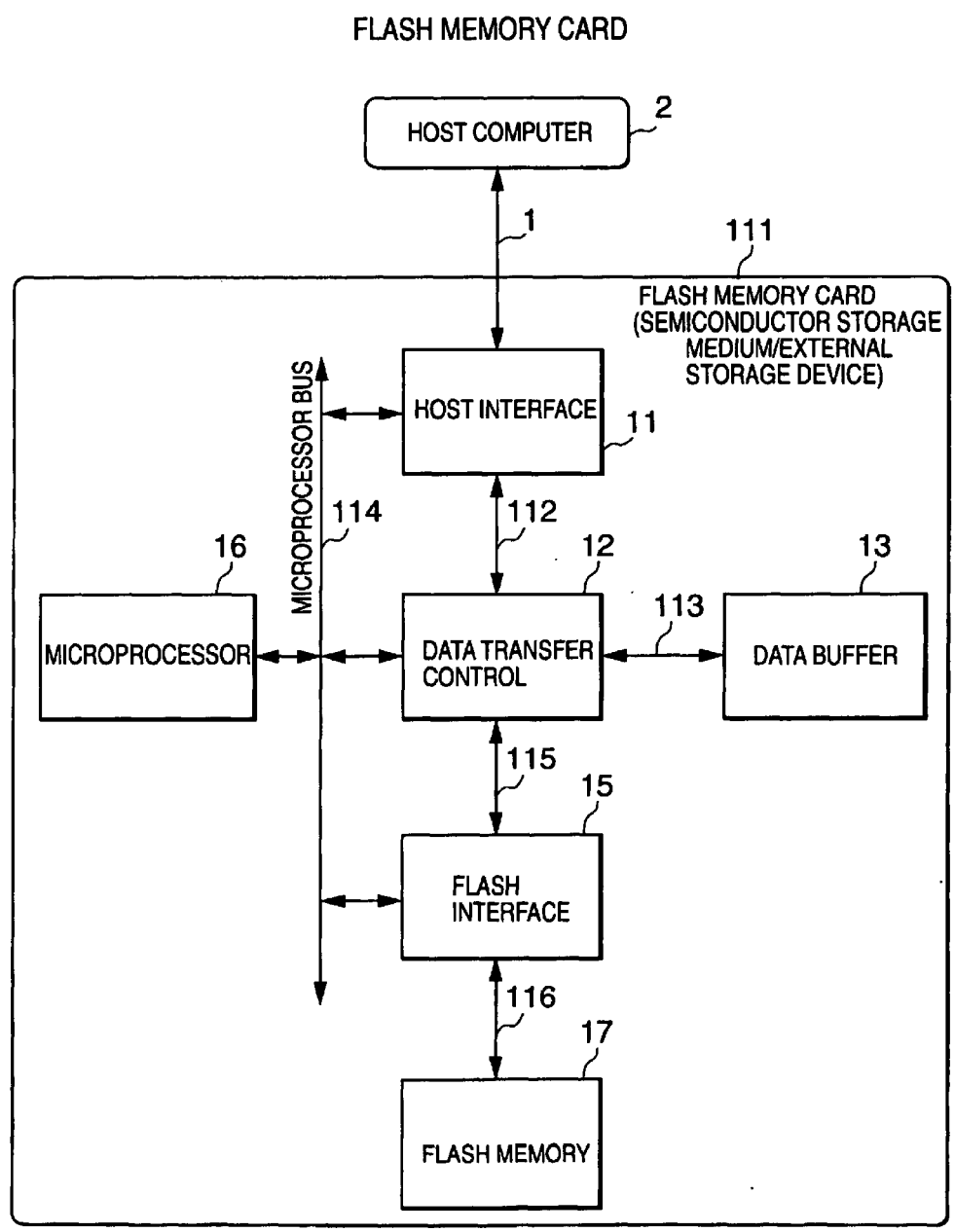
FIG. 2 is a block diagram of a flash memory card which is one embodiment of the external storage device according to the present invention.

FIG. 2 shows the construction of an external storage device which is one embodiment of the present invention, and is applied to an external storage device for a computer.

FIG. 2 shows the case in which an external storage device 111 which is one embodiment of the present invention is connected to a host computer 2.

The external storage device 111 can be used as the semiconductor storage medium 110 shown in FIG. 1. The external storage device 111 is also called a flash memory card because the external storage device 111 uses a flash memory as a non-volatile semiconductor memory. The external storage device 111 will be hereinafter referred to as the flash memory card 111.

The host computer 2 corresponds to the dedicated terminal 105, the general purpose information processing system 106 provided with the semiconductor storage medium access part 107, or the information playback systems 108 or 109 shown in FIG. 1. The host computer 2 is not particularly limited to any of those shown in FIG. 1, and may also be a personal computer or a digital still camera which needs an external storage device.

The following description is given on the assumption that the flash memory card 111 which serves as the external storage device stores sector data written by the host computer 2. In an external storage device for a personal computer, its sector data is 512- or 1024-byte data, and the sector data is transferred from the host computer 2 in units of 8 or 16 bits. In a digital still camera, the dedicated terminal 105, the general purpose information processing system 106 provided with the semiconductor storage medium access part 107, and the information playback system 108 or 109, the sizes and transfer formats of their sector data differ variously and are not particularly specified.

Referring to FIG. 2, the flash memory card 111 accepts a command from the host computer 2 or exchanges sector data via a bus 1. In the example shown in FIG. 2, the PCMCIA bus, which complies with a PCMCIA interface, is used as the bus 1. Besides the PCMCIA interface, there are various interfaces such as IDE (ATA) and SCSI interfaces, and any interface that has a protocol for transferring data to/from the host computer 2 which needs the external storage device 111 can be adopted.

The flash memory card 111 includes a host interface 11 for providing an interface with the host computer 2, a data transfer control 12 which controls the transfer of sector data between the host computer 2 and a data buffer 13 and the transfer of sector data between the data buffer 13 and a flash memory 17, the data buffer 13 which temporarily stores sector data during the exchange of sector data between the flash memory card 111 and the host computer 2, a flash interface 15 for providing an interface with the flash memory 17, a microprocessor 16, and the flash memory 17 for storing sector data written by the host computer 2.

As shown in FIG. 2, in the flash memory card 111, the host interface 11, the data transfer control 12, the data buffer 13, the flash interface 15, the microprocessor 16 and the flash memory 17 are connected to one another by a bus 112, a data buffer bus 113, a microprocessor bus 114, a bus 115 and a flash bus 116.

Although FIG. 2 shows the case in which one flash memory 17 is used in the flash memory card 111, the number of flash memories is not particularly limited.

The host interface 11 performs an operation which complies with the PCMCIA interface, and includes registers which store the logical address of sector data and the number of sectors to be accessed, which are set by the host computer 2. These registers are occasionally used for other purposes. In addition, the host interface 11 generates an interrupt to the microprocessor 16 in accordance with a command issued by the host computer 2.

The data transfer control 12 operates in accordance with the instructions of the microprocessor 16. The data buffer 13 is also used as a buffer memory for temporarily storing a sector management table. The flash interface 15 operates in accordance with the instructions of the microprocessor 16.

The microprocessor 16 controls an interpretation of a command written by the host computer 2 and processing of the command, and performs management of sector data written by the host computer 2.

The flash memory 17 stores, in addition to the sector data written by the host computer 2, information for managing bad blocks in the flash memory 17 and various kinds of information about the flash memory card 111.

Figure 3:
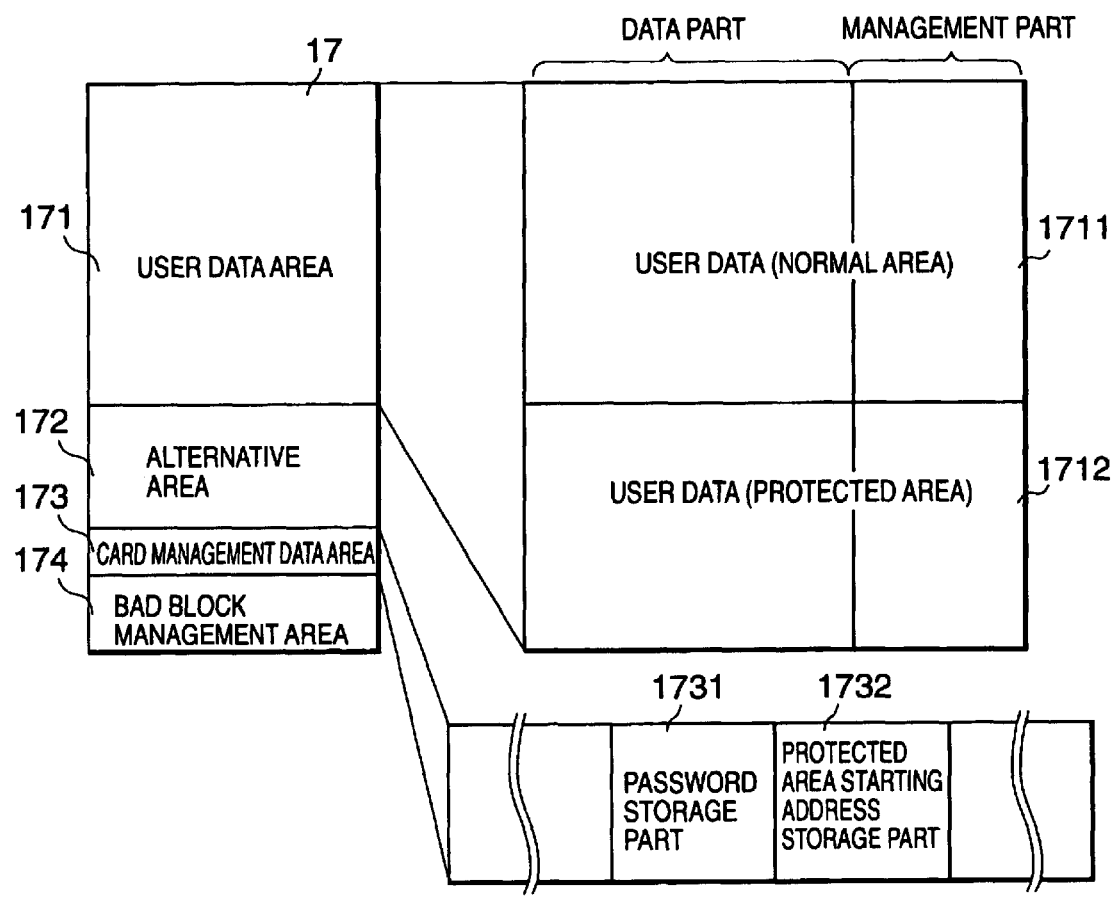
FIG. 3 shows the construction of a flash memory 17 provided in a flash memory card 111.

The construction of the flash memory 17 will be described below with reference to FIG. 3. The flash memory 17 includes a user data area 171 which stores the sector data written by the host computer 2, an alternative area 172 which serves as an alternative to bad blocks in the flash memory 17, a card management data area 173 which stores various kinds of information about the flash memory card 111, and a bad block management area 174 which stores bad block management information about the bad blocks in the flash memory 17.

The user data area 171 is divided into a normal area 1711 and a protected area 1712. The sector data written by the host computer 2 is stored in the data part of the user data area 171. Management information such as information indicative of whether each block of the data part is a good block or a bad block is stored in the management part of the user data area 171.

The card management data area 173 includes a password storage part 1731 which stores a password to be required during an authentication request from the host computer 2 and a protected area starting address storage part 1732 indicative of the starting address of a protected area 1712 in the flash memory 17, in addition to information, such as the available capacity of the flash memory card 111, which has generally been contained in a conventional external storage device. A flag indicative of whether the password is stored is contained in the password storage part 1731.

Figure 9:
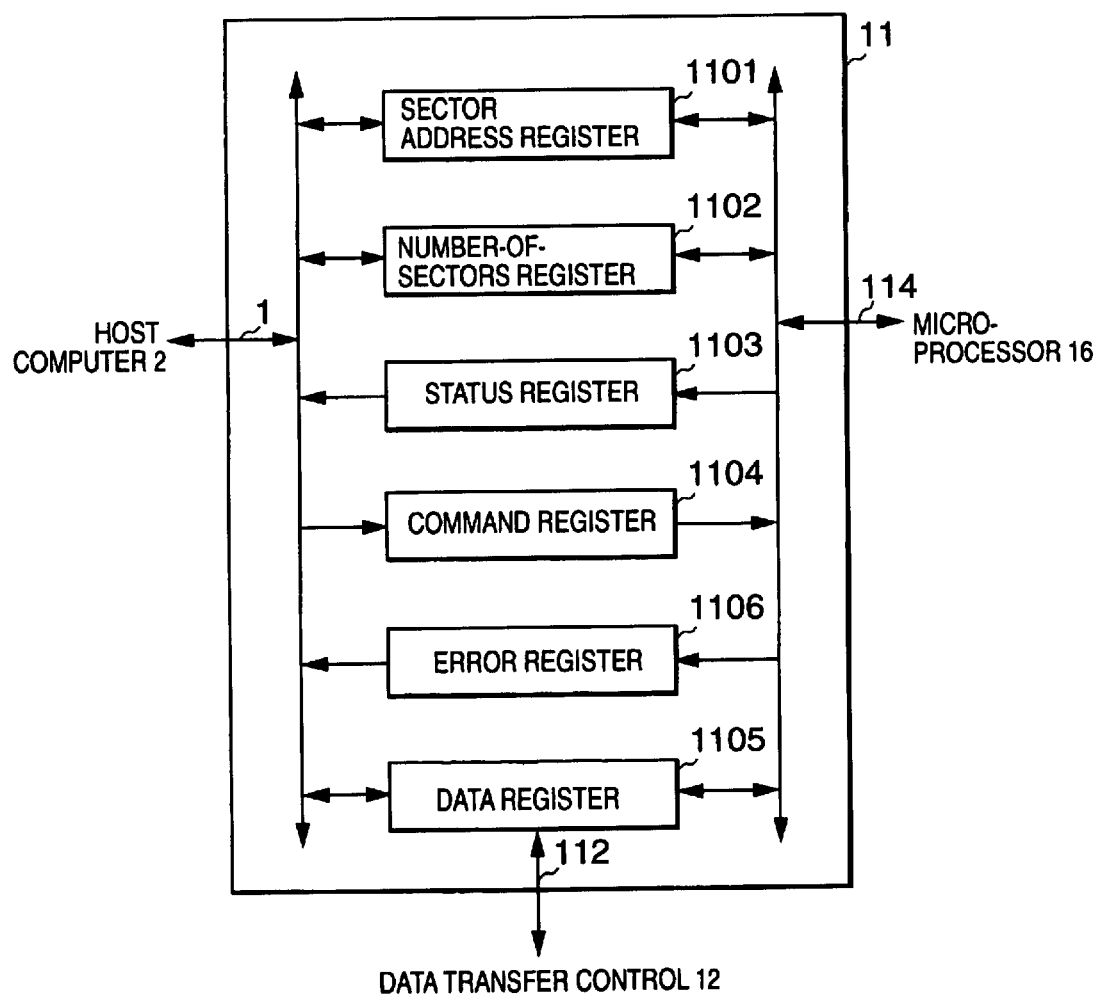
FIG. 9 is a block diagram of a host interface 11 in the flash memory card 111.

FIG. 9 is a block diagram of the host interface 11. The host interface 11 includes a sector address register 1101, into which the host computer 2 writes the starting logical address of a sector to be read, written or erased, a number-of-sectors register 1102, into which the host computer 2 writes the number of sectors to be read, written or erased, a status register 1103 for notifying the host computer 2 of the status of the flash memory card 111, a command register 1104 for storing commands issued by the host computer 2, a data register 1105 to be used for the transfer of sector data between the host computer 2 and the flash memory card 111, and an error register 1106 for notifying the host computer 2 of the kind of error. The sector address register 1101 and the number-of-sectors register 1102 can also be used as registers into which, besides a logical address and a number of sectors from the host computer 2, for example, a password is written when the password is set by the host computer 2 or when authentication based on the password is to be performed. The registers 1101 to 1105 are accessed by the host computer 2 via the PCMCIA bus 1, and by the microprocessor 16 via the microprocessor bus 114.

Access to each of the registers shown in FIG. 9 is as follows. The sector address register 1101, the number-of-sectors register 1102 and the data register 1105 can be read and written by both the host computer 2 and the microprocessor 16. The status register 1103 and the error register 1106 can only be read by the host computer 2, and can be read and written by the microprocessor 16. The command register 1104 can only be written by the host computer 2, and can only be read by the microprocessor 16.

The data register 1105 is connected to the data transfer control 12 with the bus 112, and is used for the transfer of sector data between the host computer 2 and the flash memory card 111.

Figure 10:
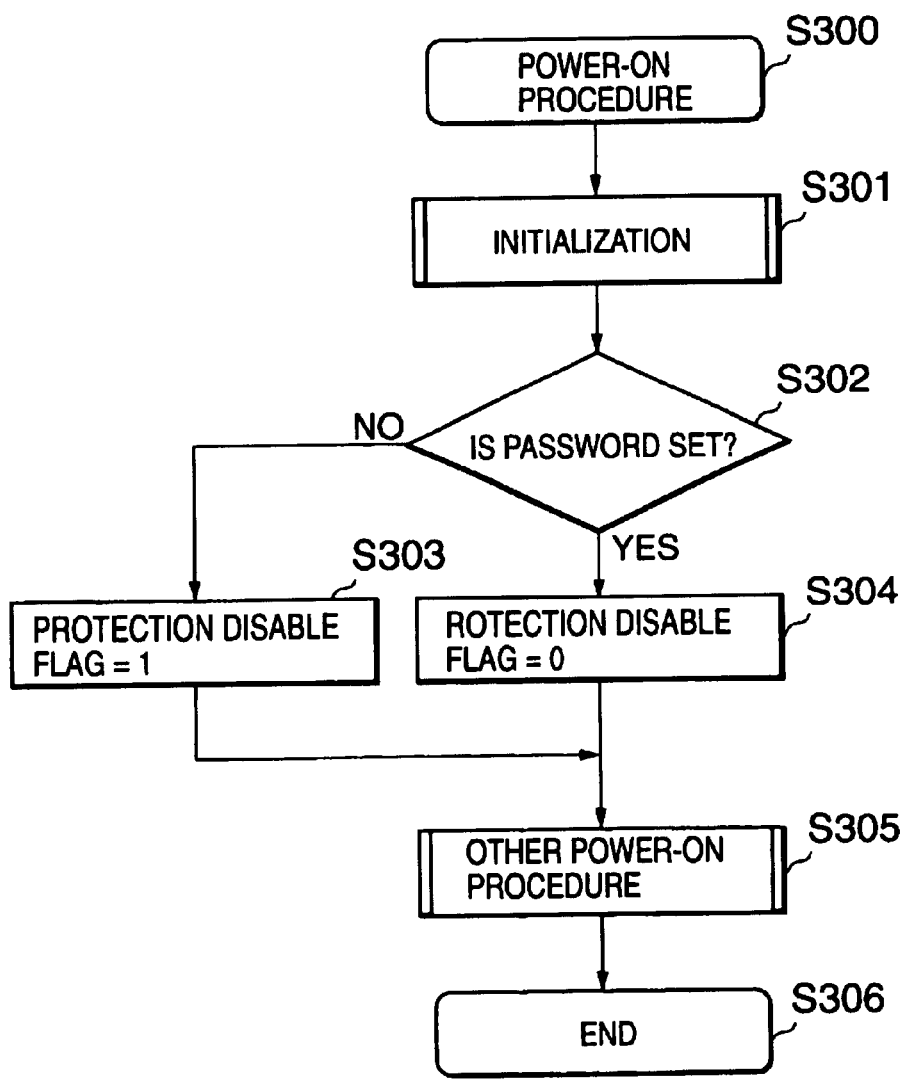
FIG. 10 shows one embodiment of a power-on procedure in the flash memory card 111.

The power-on processing of the flash memory card 111 shown in FIG. 2 will be described below. FIG. 10 shows the sequence of the power-on processing. The power-on processing is started after electricity has been supplied from the host computer 2, and makes various settings for the flash memory card 111. First of all, after electricity has been supplied from the host computer 2, in Step S301, the flash memory card 111 is initialized. In the initialization step S301, each internal setting of the microprocessor 16 is initialized, and the registers and the like of each of the host interface 11, the data transfer control 12 and the flash interface 15 are initialized. In addition, the flash memory 17 is initialized.

Then, in Step S302, the microprocessor 16 reads the password storage part 1731 of the card management data area 173, and checks whether a password is stored in the password storage part 1731. This check can be made by checking the flag of the password storage part 1731, as described above in connection with FIG. 3. If the password is stored in the password storage part 1731, in Step S304, the microprocessor 16 sets a protection disable flag which is an internal variable, to "0" (zero). If it is determined in Step S302 that no password is stored in the password storage part 1731, in Step S303, the microprocessor 16 sets the protection disable flag which is an internal variable, to "1". Subsequently to Step S303 or S304, in Step S305, the flash memory card 111 performs other power-on processing. In the other power-on processing step S305, for example, the microprocessor 16 sets the status register 1103 to a ready state and notifies the host computer 2 that the flash memory card 111 is ready to accept a command from the host computer 2.

Since the initialization step S301 and the other power-on processing step S305 shown in FIG. 10 are similar to those for conventional external storage devices, the detailed description of the same steps is omitted herein.

Figure 4:
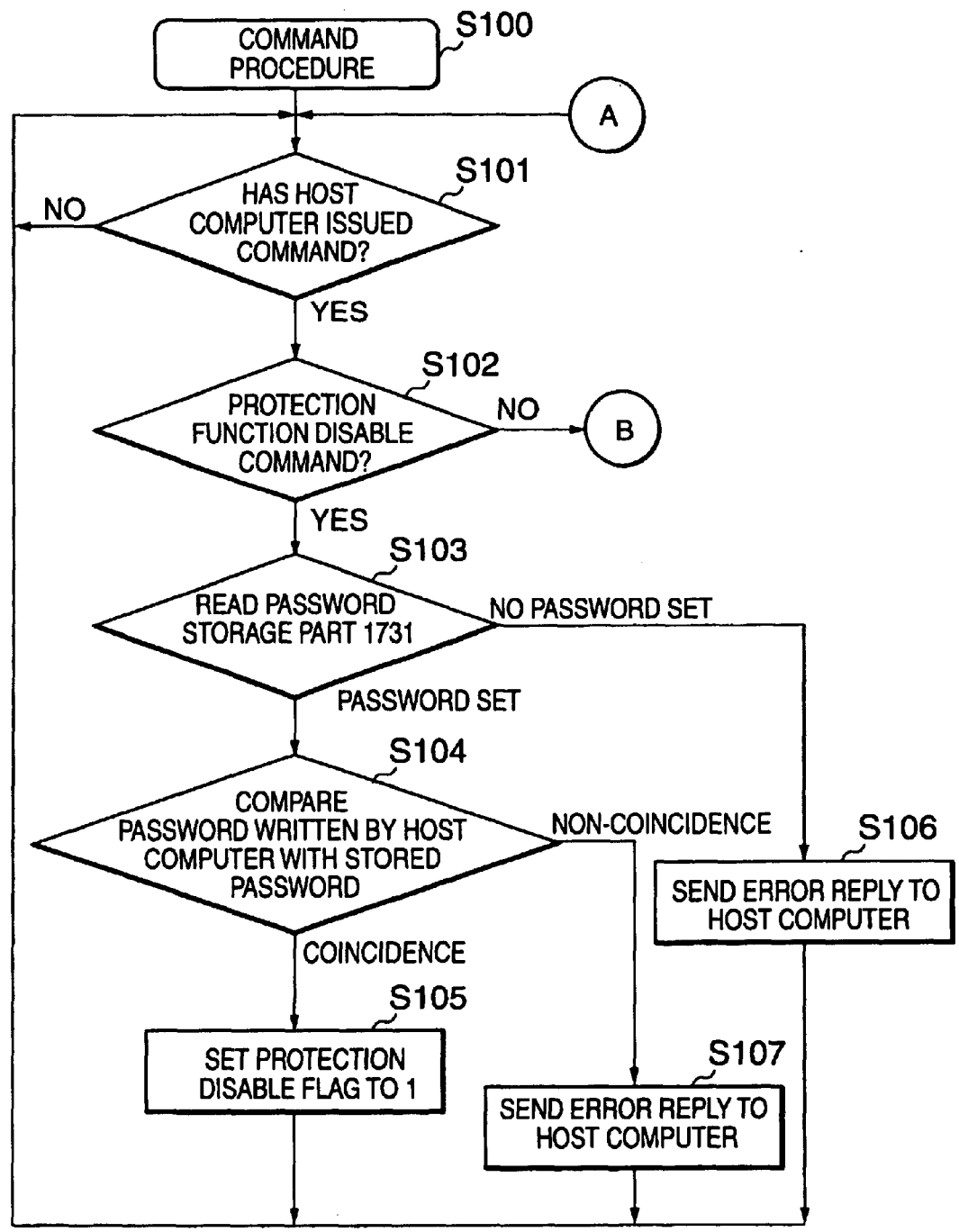
FIG. 4 shows one embodiment of the disable command procedure of a protection function in the flash memory card 111.
Figure 5:
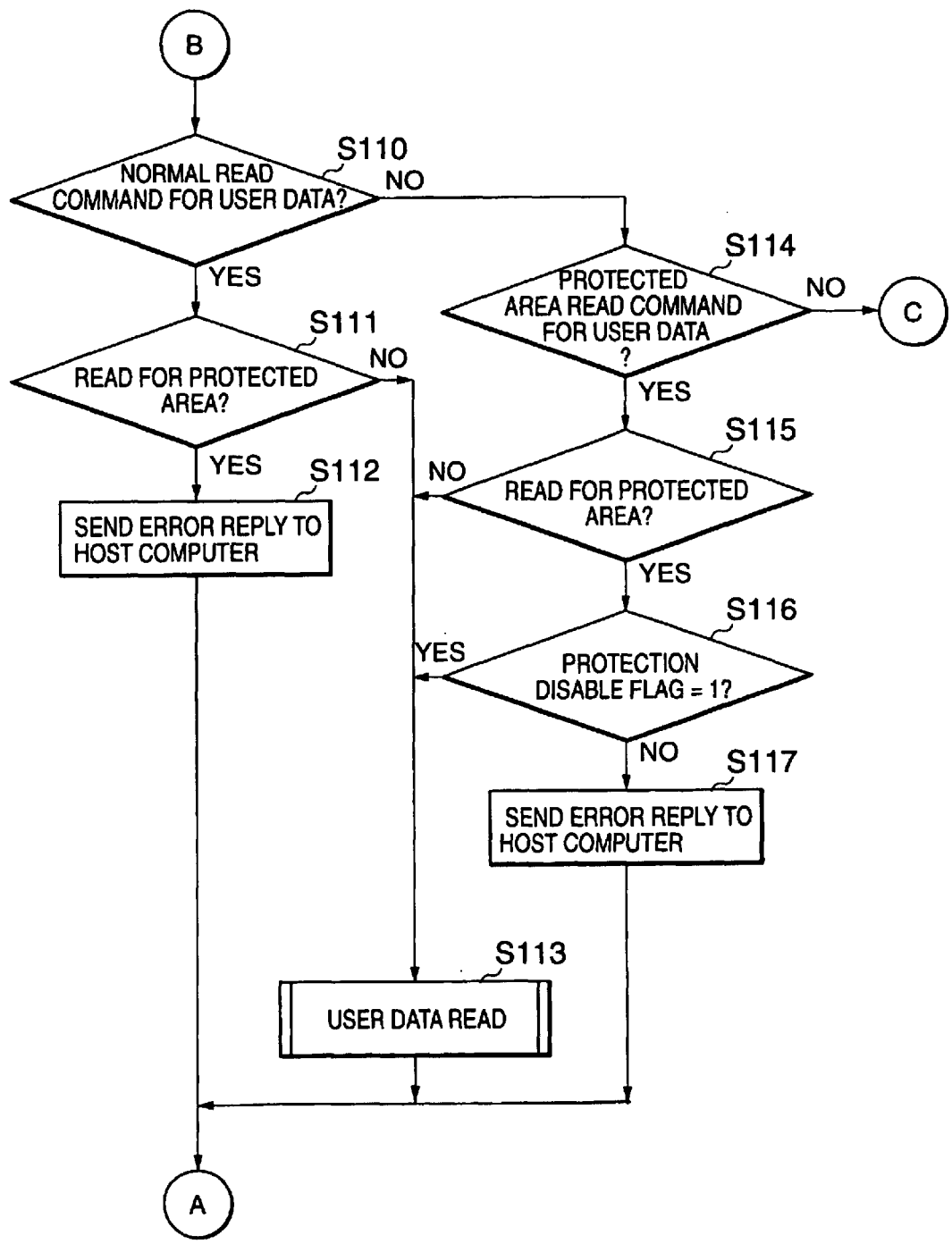
FIG. 5 shows one embodiment of a command procedure for reading sector data in the flash memory card 111.
Figure 6:
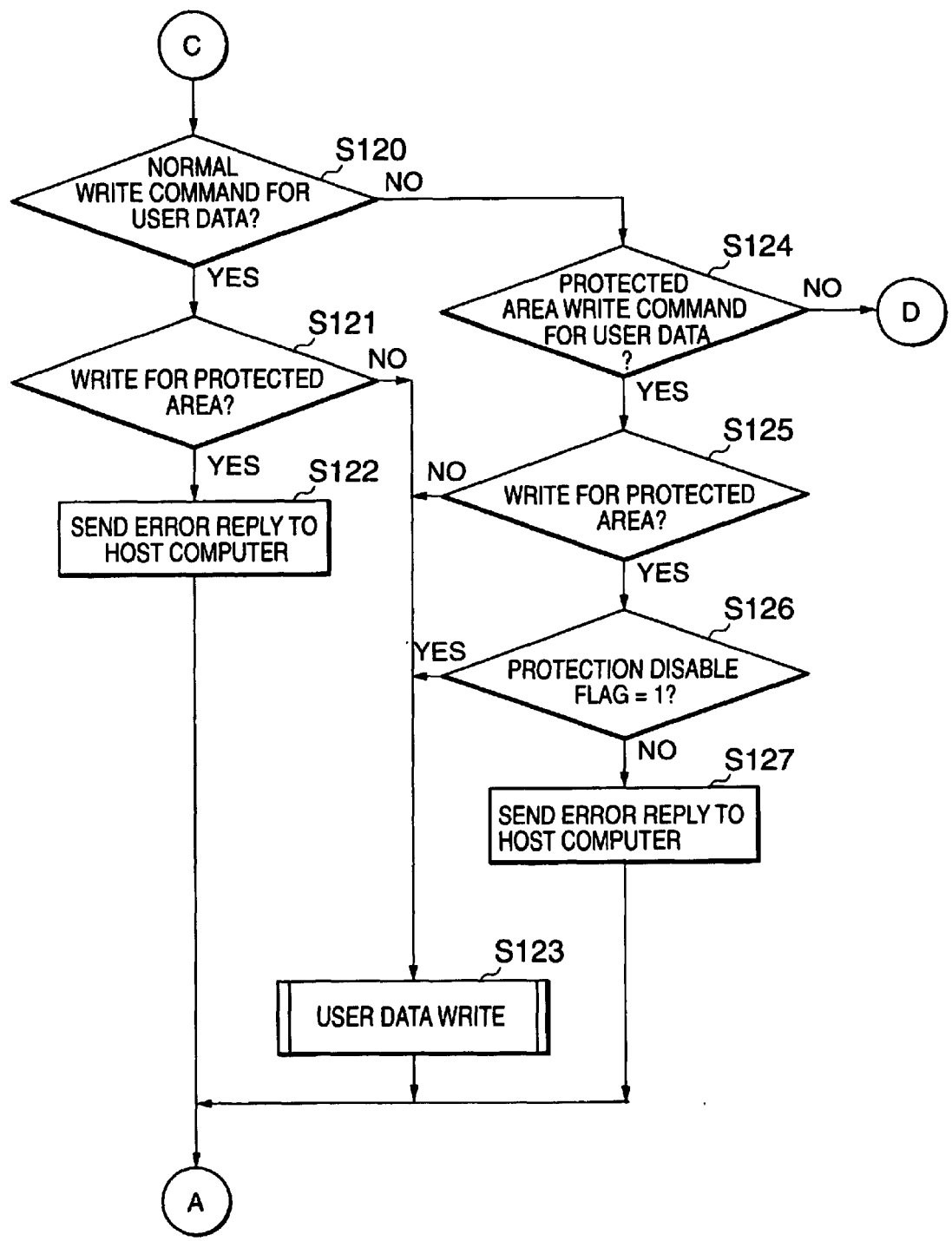
FIG. 6 shows one embodiment of a command procedure for writing sector data in the flash memory card 111.
Figure 7:
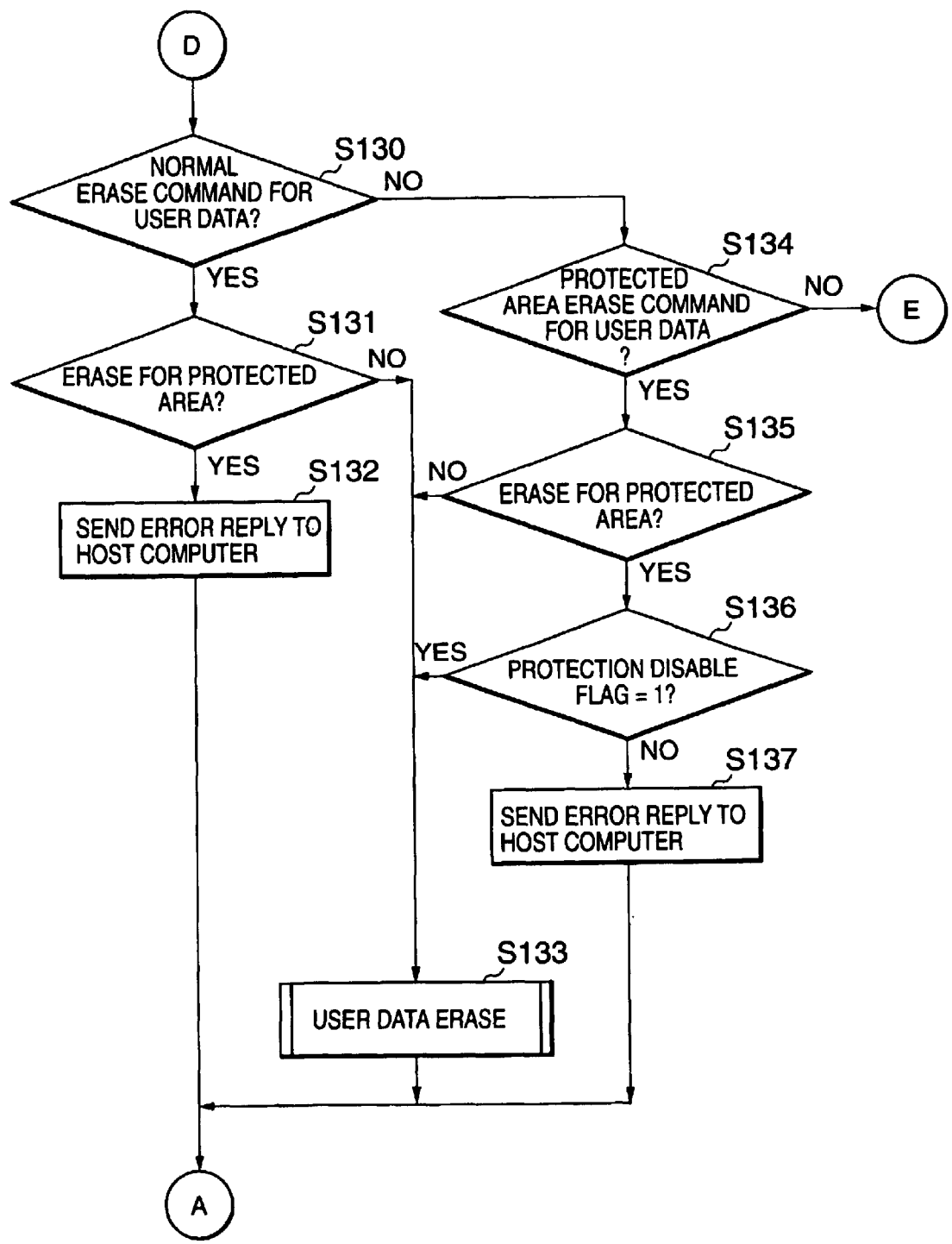
FIG. 7 shows one embodiment of a command procedure for erasing sector data in the flash memory card 111.

The command processing of the flash memory card 111 shown in FIG. 2 will be described below. FIGS. 4 to 8 show the sequence of the command processing. FIG. 4 shows the sequence of a disable command of a protection function, which performs authentication based on a password, in order to enable the host computer 2 to access the protected area 1712 of the user data area 171. FIG. 5 shows the sequence of a normal read command to read the sector data stored in the normal area 1711 of the user data area 171, and the sequence of a protected area read command to read the sector data stored in the protected area 1712 of the user data area 171. FIG. 6 shows the sequence of a normal write command to write sector data into the normal area 1711 of the user data area 171, and the sequence of a protected area write command to write sector data into the protected area 1712 of the user data area 171. FIG. 7 shows the sequence of a normal erase command to erase a block in which sector data is stored, in the normal area 1711 of the user data area 171, and the sequence of a protected area erase command to erase a block in which sector data is stored, in the protected area 1712 of the user data area 171.

Figure 8:
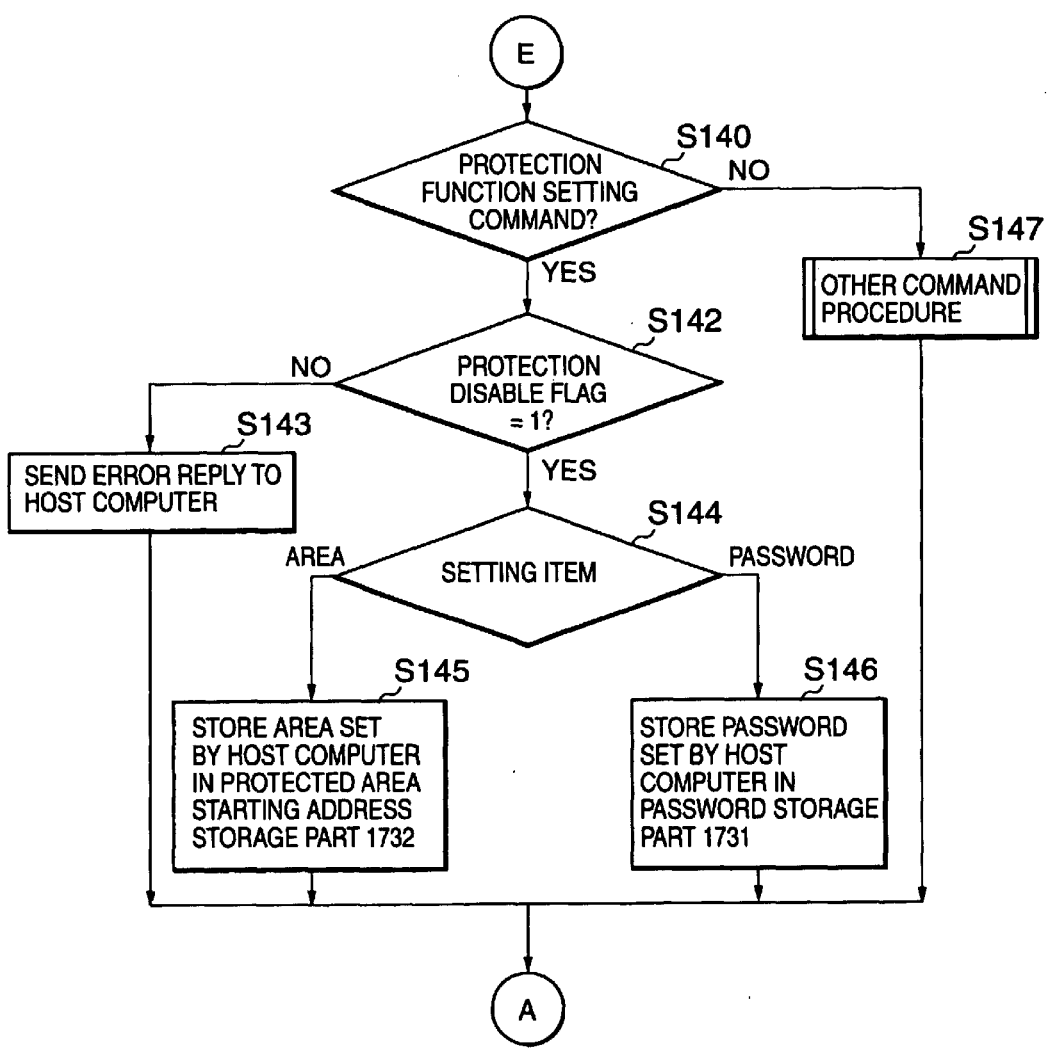
FIG. 8 shows one embodiment of the enable command procedure of the protection function in the flash memory card 111.

FIG. 8 shows the sequence of a protection function setting command with which the host computer 2 sets the password storage part 1731 and the protected area starting address storage part 1732 of the card management data area 173.

First of all, reference will be made to FIG. 4. In Step S101, the microprocessor 16 waits for the host computer 2 to issue a command. When the host computer 2 writes a command to the command register 1104 via the PCMCIA bus 1, the command register 1104 notifies the microprocessor 16 via the microprocessor bus 114.

Then, when the microprocessor 16 receives notification of the issuance of a command by the host computer 2, the microprocessor 16 makes an interpretation of the command issued by the host computer 2. The microprocessor 16 can detect the command issued by the host computer 2, by reading the command register 1104 via the microprocessor bus 114.

If the microprocessor 16 detects in Step S102 that the command written by the host computer 2 is a protection function disable command, the microprocessor 16 performs the procedure of Step S103. If the command is not a protection function disable command, the process proceeds to the procedure of Step S110 shown in FIG. 5. The host computer 2 writes a password to the sector address register 1101 before issuing the protection function disable command.

In Step S103, the microprocessor 16 tries to read a password stored in the password storage part 1731 of the card management data area 173, and checks whether the password is stored in the password storage part 1731. If the password is stored in the password storage part 1731 (the password is set), the microprocessor 16 proceeds to Step S104, whereas if the password is not stored in the password storage part 1731 (the password is not set), the microprocessor 16 proceeds to Step S106.

In Step S104, the microprocessor 16 compares the password written by the host computer 2 and stored in the sector address register 1101 with the password stored in the password storage part 1731 of the card management data area 173. If the result of the comparison indicates a coincidence, the microprocessor 16 proceeds to Step S105, whereas if the result of the comparison indicates a non-coincidence, the microprocessor 16 proceeds to Step S107.

In Step S105, the microprocessor 16 sets the protection disable flag which is an internal variable, to "1". If the value of the protection disable flag is "1", this indicates that the protection functions disabled. After Step S105, in Step 101, flash memory card 111 waits for a command to be issued from the host computer 2.

In Step S106, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that no password is stored in the password storage part 1731.

In Step S107, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the password written by the host computer 2 does not coincide with the password stored in the password storage part 1731.

After either of Steps S106 or S107, in Step S101, the flash memory card 111 waits for a command to be issued from the host computer 2.

A normal read command and a protected area read command will be described below with reference to FIG. 5. In Step S110, the microprocessor 16 checks whether the command issued by the host computer 2 is a normal read command. If the command issued by the host computer 2 is a normal read command, the microprocessor 16 proceeds to Step S111, whereas if the command issued by the host computer 2 is not a normal read command, the microprocessor 16 proceeds to Step S114.

In Step S111, the microprocessor 16 checks whether sector data to be read by the host computer 2 through the normal read command is stored in the protected area 1712. Before issuing the normal read command, the host computer 2 sets the logical address of the sector data to be read, in the sector address register 1101. The microprocessor 16 compares the starting address of the protected area 1732 with the stored address of the sector address register 1101 and determines whether the sector data to be read by the host computer 2 through the normal read command is stored in the protected area 1712.

If the microprocessor 16 determines in Step S111 that the sector data to be read by the host computer 2 through the normal read command is stored in the protected area 1712, the microprocessor 16 proceeds to Step S112 and sends an error reply to the host computer 2. In Step S112, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tried to read the sector data of the protected area 1712 through the normal read command.

If the microprocessor 16 determines in Step S111 that the sector data to be read by the host computer 2 is not stored in the protected area 1712, the microprocessor 16 proceeds to Step S113 and performs a user data read procedure. In the user data read procedure step S113, the data transfer control 12 temporarily stores the sector data stored in the flash memory 17, in the data buffer 13 via the flash interface 15, and then the host computer 2 reads the data stored in the data buffer 13 via the data register 1105 of the host interface 11.

A protected area read command will be described below. First of all, in Step S114, the microprocessor 16 checks whether the command issued by the host computer 2 is a protected area read command. If the command issued by the host computer 2 is a protected area read command, the microprocessor 16 proceeds to Step S115, whereas if the command issued by the host computer 2 is not a protected area read command, the microprocessor 16 proceeds to Step S120 of FIG. 6.

In Step S115, the microprocessor 16 checks whether sector data to be read by the host computer 2 through the protected area read command is stored in the protected area 1712. Before issuing the protected area read command, the host computer 2 sets the logical address of the sector data to be read, in the sector address register 1101. The microprocessor 16 compares the starting address of the protected area 1732 with the stored address of the sector address register 1101 and determines whether the sector data to be read by the host computer 2 through the protected area read command is stored in the protected area 1712.

If the microprocessor 16 determines in Step S115 that the sector data to be read by the host computer 2 is not stored in the protected area 1712, the microprocessor 16 proceeds to Step S113. Since Step S113 has already been described, the description of the same step is omitted.

If the microprocessor 16 determines in Step S115 that the sector data to be read by the host computer 2 is stored in the protected area 1712, the microprocessor 16 proceeds to Step S116 and checks the protection disable flag which is an internal variable of the microprocessor 16.

In Step S116, if the value of the protection disable flag is "1", i. e., the protection function is disabled (in the power-on procedure of FIG. 10, no password is stored in the password storage part 1731, or in the disable command procedure of the protection function of FIG. 4, the host computer 2 disables the protection function), the microprocessor 16 proceeds to Step S113. Since Step S113 has already been described, the description of the same step is omitted.

If the microprocessor 16 determines in Step S116 that the value of the protection disable flag is not "1", i.e., "0" which indicates that the protection function is not disabled, the microprocessor 16 proceeds to Step S117 and sends an error reply to the host computer 2. In Step S117, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tried to read the sector data of the protected area 1712 through the protected area read command without disabling the protection function.

After any of Steps S112, S113 and S117, the flash memory card 111 waits for a command to be issued from the host computer 2 in Step S101.

A normal write command and a protected area write command will be described below with reference to FIG. 6. In Step S120, the microprocessor 16 checks whether the command issued by the host computer 2 is a normal write command. If the command issued by the host computer 2 is a normal write command, the microprocessor 16 proceeds to Step S121, whereas if the command issued by the host computer 2 is not a normal write command, the microprocessor 16 proceeds to Step S124.

In Step S121, the microprocessor 16 checks whether the host computer 2 writes sector data to the protected area 1712 through the normal write command. Before issuing the normal write command, the host computer 2 sets the logical address of the sector data to be written, in the sector address register 1101. The microprocessor 16 compares the starting address of the protected area 1732 with the stored address of the sector address register 1101 and determines whether the sector data to be written by the host computer 2 through the normal write command is stored in the protected area 1712.

If the microprocessor 16 determines in Step S121 that an area to which the host computer 2 is to write the sector data is the protected area 1712, the microprocessor 16 proceeds to Step S122 and sends an error reply to the host computer 2. In Step S122, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tried to write the sector data to the protected area 1712 through the normal write command.

If the microprocessor 16 determines in Step S121 that an area to which the host computer 2 is to write the sector data is not the protected area 1712, the microprocessor 16 proceeds to Step S123 and performs a user data write procedure. In the user data write procedure step S123, the data transfer control 12 temporarily stores the sector data written by the host computer 2 via the data register 1105, in the data buffer 13, and then writes the data stored in the data buffer 13 to the flash memory 17 via the flash interface 15.

A protected area write command will be described below. First of all, in Step S124, the microprocessor 16 checks whether the command issued by the host computer 2 is a protected area write command. If the command issued by the host computer 2 is a protected area write command, the microprocessor 16 proceeds to Step S125, whereas if the command issued by the host computer 2 is not a protected area write command, the microprocessor 16 proceeds to Step S130 of FIG. 7.

In Step S125, the microprocessor 16 checks whether an area to which the host computer 2 is to write sector data through the protected area write command is the protected area 1712. Before issuing the protected area write command, the host computer 2 sets the logical address of the sector data to be written, in the sector address register 1101. The microprocessor 16 compares the starting address of the protected area 1732 with the stored address of the sector address register 1101 and determines whether the sector data to be written by the host computer 2 through the protected area write command is stored in the protected area 1712.

If the microprocessor 16 determines in Step S125 that the area to which the host computer 2 is to write the sector data is not the protected area 1712, the microprocessor 16 proceeds to Step S123. Since Step S123 has already been described, the description of the same step is omitted.

If the microprocessor 16 determines in Step S125 that the area to which the host computer 2 is to write the sector data is the protected area 1712, the microprocessor 16 proceeds to Step S126 and checks the protection disable flag which is an internal variable of the microprocessor 16.

In Step S126, if the value of the protection disable flag is "1", i.e., the protection function is disabled (in the power-on procedure of FIG. 10, no password is stored in the password storage part 1731, or in the disable command procedure of the protection function of FIG. 4, the host computer 2 disables the protection function), the microprocessor 16 proceeds to Step S123. Since Step S123 has already been described, the description of the same step is omitted.

If the microprocessor 16 determines in Step S126 that the value of the protection disable flag is not "1", i.e., "0" which indicates that the protection function is not disabled, the microprocessor 16 proceeds to Step S127 and sends an error reply to the host computer 2. In Step S127, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tried to write the sector data to the protected area 1712 through the protected area write command without disabling the protection function.

After any of Steps S122, S123 and S127, in Step S101, the flash memory card 111 waits for a command to be issued from the host computer 2.

A normal erase command and a protected area erase command will be described below with reference to FIG. 7. In Step S130, the microprocessor 16 checks whether the command issued by the host computer 2 is a normal erase command. If the command issued by the host computer 2 is a normal erase command, the microprocessor 16 proceeds to Step S131, whereas if the command issued by the host computer 2 is not a normal erase command, the microprocessor 16 proceeds to Step S134.

In Step S131, the microprocessor 16 checks whether the host computer 2 erases the block of the protected area 1712 that stores sector data, through the normal erase command.

Before issuing the normal erase command, the host computer 2 sets the logical address of the sector data to be erased, in the sector address register 1101. The microprocessor 16 compares the starting address of the protected area 1732 with the stored address of the sector address register 1101 and determines whether the host computer 2 tries to erase the block of the protected area 1712 through the normal erase command.

If the microprocessor 16 determines in Step S131 that an area to be erased by the host computer 2 is the protected area 1712, the microprocessor 16 proceeds to Step S132 and sends an error reply to the host computer 2. In Step S132, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tries to erase the area of the protected area 1712 through the normal erase command.

If the microprocessor 16 determines in Step S131 that an area to be erased by the host computer 2 is not the protected area 1712, the microprocessor 16 proceeds to Step S133 and performs a user data erase procedure. In the user data erase procedure step S133, under the control of the microprocessor 16, the logical address of the area to be erased in the flash memory 17 and an erase command for the flash memory 17 are issued via the flash interface 15, thereby executing an erase.

A protected area erase command will be described below. First of all, in Step S134, the microprocessor 16 checks whether the command issued by the host computer 2 is a protected area erase command. If the command issued by the host computer 2 is a protected area erase command, the microprocessor 16 proceeds to Step S135, whereas if the command issued by the host computer 2 is not a protected area erase command, the microprocessor 16 proceeds to Step S140 of FIG. 8.

In Step S135, the microprocessor 16 checks whether an area to be erased by the host computer 2 through the protected area erase command is the protected area 1712. Before issuing the protected area erase command, the host computer 2 sets the logical address of the sector data to be erased, in the sector address register 1101. The microprocessor 16 compares the starting address of the protected area 1732 with the stored address of the sector address register 1101 and determines whether the sector data to be erased by the host computer 2 through the protected area erase command is stored in the protected area 1712.

If the microprocessor 16 determines in Step S135 that the area to be erased by the host computer 2 is not the protected area 1712, the microprocessor 16 proceeds to Step S133. Since Step S133 has already been described, the description of the same step is omitted. If the microprocessor 16 determines in Step S135 that the area to be erased by the host computer 2 is the protected area 1712, the microprocessor 16 proceeds to Step S136 and checks the protection disable flag which is an internal variable of the microprocessor 16.

In Step S136, if the value of the protection disable flag is "1", i.e., the protection function is disabled (in the power-on procedure of FIG. 10, no password is stored in the password storage part 1731, or in the disable command procedure of the protection function of FIG. 4, the host computer 2 disables the protection function), the microprocessor 16 proceeds to Step S133. Since Step S133 has already been described, the description of the same step is omitted.

If the microprocessor 16 determines in Step S136 that the value of the protection disable flag is not "1", i.e., "0" which indicates that the protection function is not disabled, the microprocessor 16 proceeds to Step S137 and sends an error reply to the host computer 2. In Step S137, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 tried to erase the area of the protected area 1712 through the protected area erase command without disabling the protection function.

After any of Steps S132, S133 and S137, in Step S101, the flash memory card 111 waits for a command to be issued from the host computer 2.

A protection function setting command will be described below with reference to FIG. 8. In Step S140, the microprocessor 16 checks whether the command issued by the host computer 2 is a protection function setting command. If the command issued by the host computer 2 is a protection function setting command, the microprocessor 16 proceeds to Step S142, whereas if the command issued by the host computer 2 is not a protection function setting command, the microprocessor 16 proceeds to Step S147.

In Step 142, the microprocessor 16 checks the protection disable flag which is an internal variable of the microprocessor 16. If the value of the protection disable flag is "1", i.e., the protection function is disabled (in the power-on procedure of FIG. 10, no password is stored in the password storage part 1731, or in the disable command procedure of the protection function of FIG. 4, the host computer 2 disables the protection function), the microprocessor 16 proceeds to Step S144. If the value of the protection disable flag is not "1", i.e., "0" which indicates that the protection function is not disabled, the microprocessor 16 proceeds to Step S143 and sends an error reply to the host computer 2. In Step S143, in order to reply that an error has occurred with respect to the command issued by the host computer 2, the microprocessor 16 sets data indicative of the error in the status register 1103. At the same time, the microprocessor 16 sets, in the error register 1106, data which indicates that the cause of the error is that the host computer 2 issued the protection function setting command without disabling the protection function.

Before issuing the protection function setting command, the host computer 2 sets a setting item for the protection function setting command (a protected area or a password) in the sector address register 1101. When the host computer 2 is to set a protected area, the host computer 2 sets the starting address of the protected area, in the number-of-sectors register 1102, while when the host computer 2 is to set a password, the host computer 2 sets a new password in the number-of-sectors register 1102.

In Step S144, the microprocessor 16 reads the sector address register 1101 and checks the item to be set by the host computer 2 through the protection function setting command. If a change of the protected area is set in the sector address register 1101, the microprocessor 16 executes Step S145, whereas if a change of the password is set in the sector address register 1101, the microprocessor 16 executes Step S146.

In Step S145, the microprocessor 16 stores information on the protected area, which is stored in the number-of-sectors register 1102, in the protected area starting address storage part 1732 of the card management data area 173.

In Step S146, the microprocessor 16 stores the password in the number-of-sectors register 1102 in the password storage part 1731 of the card management data area 173.

The other command procedure of Step S147 in FIG. 8 is a routine which processes commands other than the commands described above in connection with FIGS. 4 to 8. In the other command procedure, by using the protection disable flag, it is possible to provide various protections against the other commands received from the host computer 2.

As described above, according to the above embodiment, when the host computer 2 is to read, write and erase the normal area and the protected area, both of which store user data, it is possible to process reading, writing and erasing in different commands, respectively. In addition, the reading, writing and erasing of the protected area can be restricted through authentication using a password. In addition, it is possible to change the starting address of the protected area by the host computer 2.

Figure 11:
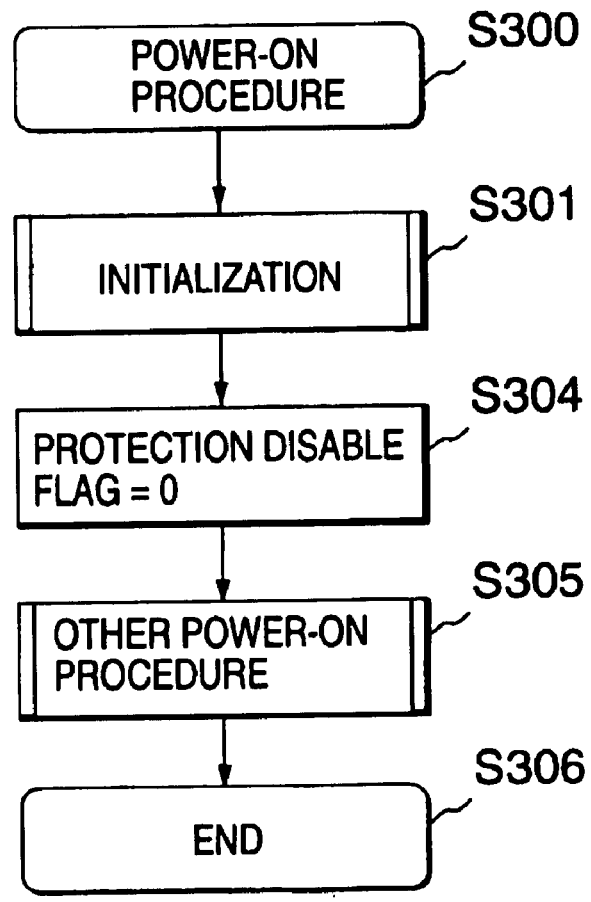
FIG. 11 shows another embodiment of the power-on procedure in the flash memory card 111.
Figure 12:
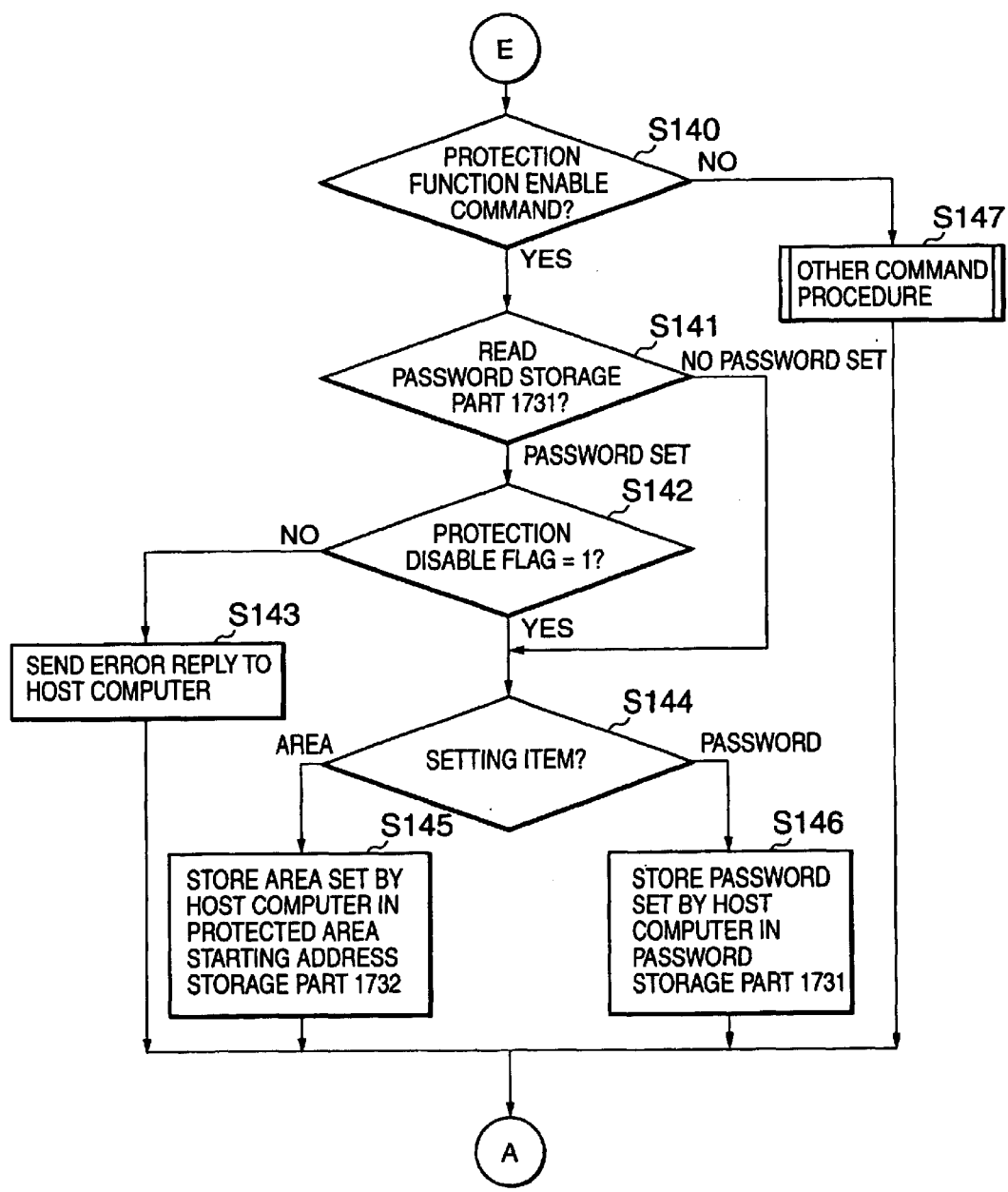
FIG. 12 shows another embodiment of the enable command procedure of the protection function in the flash memory card 111.

Another embodiment of the present invention will be described below with reference to FIGS. 11 and 12. FIG. 11 shows another embodiment of the power-on procedure of the flash memory card 111 shown in FIG. 2, which is different from the power-on procedure shown in FIG. 10. FIG. 12 shows another embodiment of the protection function setting command of the flash memory card 111 shown in FIG. 2, which is different from the protection function setting command shown in FIG. 8.

The difference between the embodiments shown in FIGS. 10 and 11 is as follows. In the embodiment shown in FIG. 10, the initialization of the protection disable flag is switched according to whether the password is stored in the password storage part 1731 (Step S302). In the embodiment shown in FIG. 11, the protection disable flag is invariably initialized to "0" (zero) (Step S304) irrespective of the contents of the password storage part 1731.

The difference between the embodiments shown in FIGS. 8 and 12 is that in the embodiment shown in FIG. 12, a check is made as to whether a password is stored in the password storage part 1731 (Step S141).

In the embodiment shown in FIG. 11, since the protection disable flag is invariably initialized to "0" (zero), if the host computer 2 is to access the protected area 1712 through the protected area read command, the protected area write command or the protected area erase command in the case where no password is set, the host computer 2 must set a password through the protection function setting command and disable the protection function through the protection function disable command. Accordingly, it is possible to provide a highly reliable external storage device.

Figure 13:
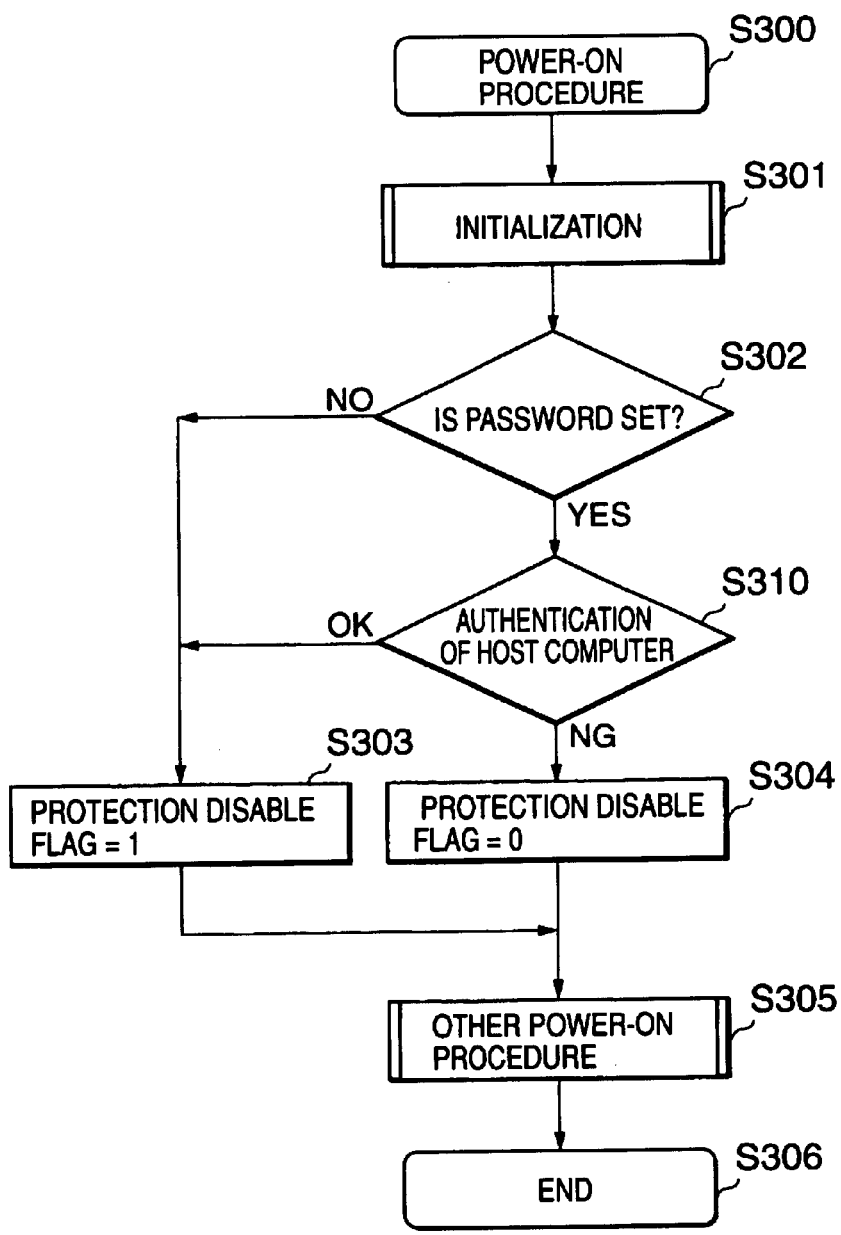
FIG. 13 shows another embodiment of the power-on procedure in the flash memory card 111.

FIG. 13 shows another embodiment of the present invention. FIG. 13 shows another embodiment of the power-on procedure of the flash memory card 111 shown in FIG. 2, which is different from the power-on procedure shown in FIG. 10.

The difference between the embodiments shown in FIGS. 10 and 13 is as follows. In the embodiment shown in FIG. 10, the initialization of the protection disable flag is carried out according to whether the password is stored in the password storage part 1731 (Step S302). In the embodiment shown in FIG. 13, a check is made as to whether the password is stored in the password storage part 1731 (Step S302), and if the password is set, the authentication of the host computer 2 is performed in Step S310. Accordingly, it is possible to provide a highly reliable external storage device.

Figure 14:
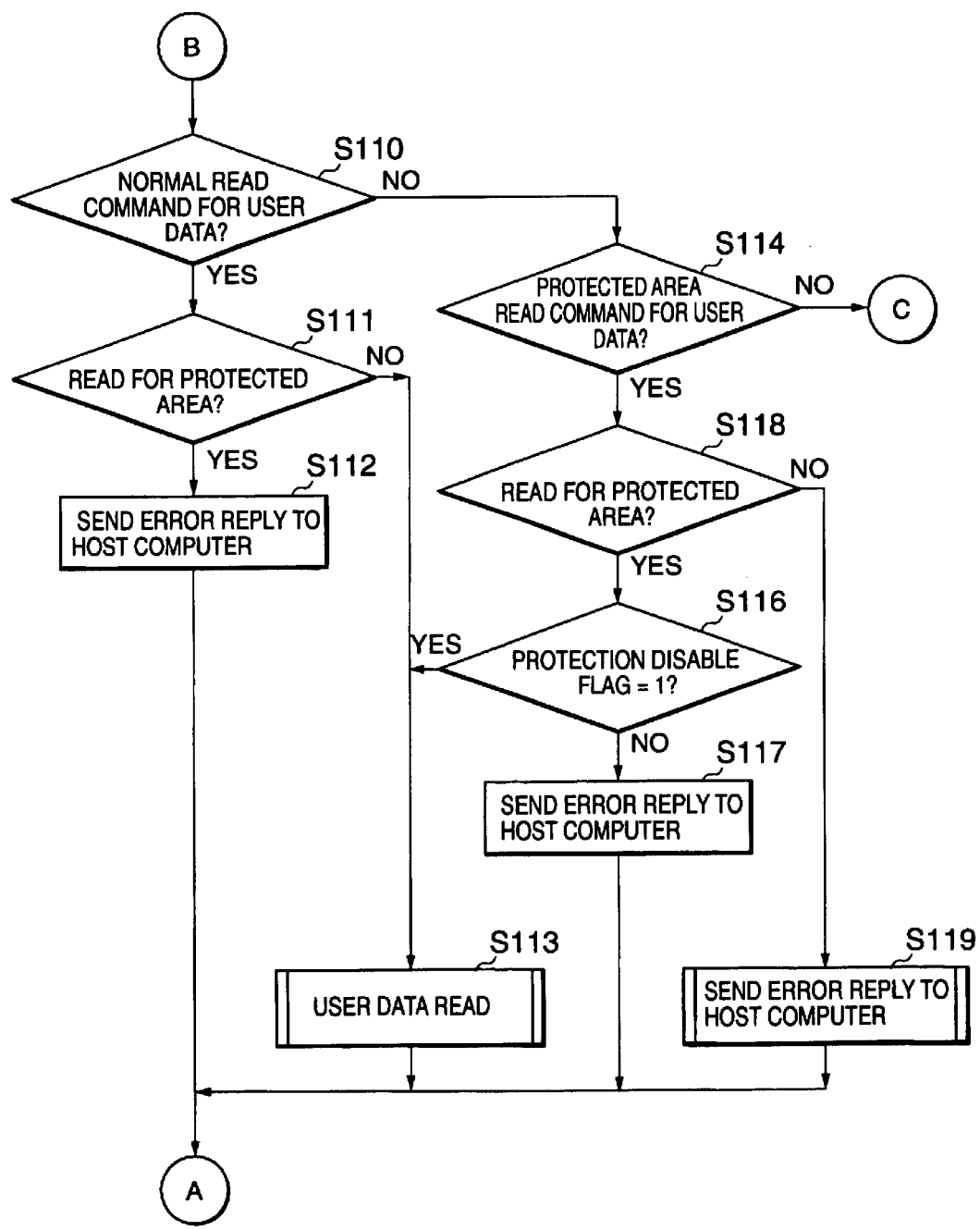
FIG. 14 shows another embodiment of the command procedure for reading sector data in the flash memory card 111.

FIG. 14 shows another embodiment of the present invention. FIG. 14 shows another embodiment of the protected area read command of the flash memory card 111 shown in FIG. 2, which is different from the protected area read command shown in FIG. 5.

The difference between the embodiments shown in FIGS. 5 and 14 is as follows. In the embodiment shown in FIG. 5, in Step S115, the host computer 2 can read sector data from the normal area 1711 other than the protected area 1712 through the protected area read command, whereas in the embodiment shown in FIG. 14, in Step S118, if the host computer 2 is to read an area other than the protected area 1712 through the protected area read command, the microprocessor 16 sends an error reply to the host computer 2 (Step S119). Thus, the flash memory card 111 enables the host computer 2 to read the normal area 1711 and the protected area 1712 of the user data area 171 through different commands.

Although FIG. 14 shows the case of read command, it is possible to realize writing and erasing for plural area through different write commands and different erase commands in the same way.

In addition, although the embodiments shown above utilize authentication using a password, the means of authentication is not particularly limited to the password. For example, it is possible to use authentication with public key cryptosystem.

According to the present invention, by using a command or an authentication procedure such as a password, it is possible to restrict access to a user data area by a host computer and improve the reliability of the user data area, whereby it is possible to provide an external storage device the data of which can be protected.

Moreover, it is possible to dynamically change the area of the user data area an access to which by a host computer is restricted, whereby the ease of use of the external storage device for the host computer can be improved.

What is claimed is:

1. An external storage device connectable to a host computer, comprising:

a non-volatile semiconductor memory;

an interface to connect to the host computer; and a controller to access the non-volatile semiconductor memory in response to a command and an address from the host computer;

wherein said non-volatile semiconductor memory is divided into plural areas;

wherein a first command for accessing a first area among said plural areas of the non-volatile semiconductor memory is different from a second command for accessing a second area among said plural areas of the non-volatile semiconductor memory;

wherein the controller determines whether the command from the host computer is the first command or the second command, wherein, when the command is the first command, the controller carries out first command processing to a sector of the first area in accordance with the address from the host computer; and wherein, when the command is the second command, the controller carries out second command processing to a sector of the second area in accordance with the address from the host computer, further comprising information indicative of the plural areas of the non-volatile semiconductor memory, the external storage device dynamically changing the sizes of the first and second areas of the non-volatile semiconductor memory on the basis of an instruction of the host computer by a part which rewrites the information indicating of the plural areas of the non-volatile semiconductor memory.

2. An external storage device according to claim 1, wherein the non-volatile semiconductor memory includes plural areas in which a data area is made of a protected data area and a non-protected data area, wherein, when the host computer is to access the protected data area, the external storage device performs authentication through an authentication procedure for accessing to the protected data area, and wherein said first area is the non-protected data area and the second area is the protected data area.

3. An external storage device according to claim 1, further comprising a part, which is provided in the connecting part and recognizes the kind of host computer during activation, performing access control on the plural areas of the non-volatile semiconductor memory according to the kind of host computer.

4. An external storage device according to claim 1, the plural areas comprising:

a user data area for storing user data therein; and a management data area for storing management data therein;

the user data area further comprising said first and second areas, wherein said first area is a normal area and said second area is a protected area.

5. An external storage device according to claim 4, wherein:

the first commands are commands for accessing to the normal area, the second commands are commands for accessing to the protected area, and the first commands for accessing to the normal area and the second commands for accessing to the protected area are different from each other.

6. An external storage device according to claim 5, wherein:

the management data area stores a start address of the protected area; and the part for controlling the non-volatile semiconductor memory accesses the protected area when the second command for accessing to the protected area and an address issued prior to the commands by the host computer coincides with the start address of the protected area within the management data area and a protection function of the protected area is disabled.

7. An external storage device according to claim 4, wherein:

the management data area stores a start address of the protected area; and the part for controlling the non-volatile semiconductor memory accesses the protected area when an address issued prior to the commands by the-host computer coincides with the start address of the protected area within the management data area.

8. An external storage device according to claim 4, wherein:

the part for controlling the non-volatile semiconductor memory carries out authentication of a user, and it disables a protection function of the protected area when the authentication of the user is successful.

9. An external storage device according to claim 8, wherein:

the management data area stores a password of the user; and the part for controlling the non-volatile semiconductor memory carries out the authentication of the user by comparing a password from the host computer to the password stored in the management data area.

10. An external storage device according to claim 8, wherein:

the part for controlling the non-volatile semiconductor memory carries out the authentication of the user when a command from the host computer is a protection disabling command for disabling the protection function for the protected area.

11. An external storage device according to claim 8, wherein:

the part for controlling the non-volatile semiconductor memory carries out authentication of the user when the external storage device is turned on.

12. An external storage device connectable to a host computer, comprising:

a non-volatile semiconductor memory;

an interface to connect to the host computer; and a controller to access the non-volatile semiconductor memory in response to a command and an address from the host computer;

wherein said non-volatile semiconductor memory is divided into plural areas;

wherein a first command for accessing a first area among said plural areas of the non-volatile semiconductor memory is different from a second command for accessing a second area among said plural areas of the non-volatile semiconductor memory;

wherein the controller determines whether the command from the host computer is the first command or the second command, wherein, when the command is the first command, the controller carries out first command processing to a sector of the first area in accordance with the address from the host computer; and wherein, when the command is the second command, the controller carries out second command processing to a sector of the second area in accordance with the address from the host computer, wherein the non-volatile semiconductor memory includes an area which stores data of the host computer and an area which stores information on the external storage device, wherein the area of the non-volatile semiconductor memory which stores the data of the host computer is made of a protected data area and a non-protected data area, wherein the area of the non-volatile semiconductor memory which stores the information on the external storage device stores location information on the protected data area, wherein the external storage device dynamically changes the protected data area of the non-volatile semiconductor memory on the basis of an instruction of the host computer by a part which rewrites the location information on the protected data area of the non-volatile semiconductor memory, wherein, when the host computer is to access the protected data area, the external storage device performs authentication through an authentication procedure for accessing to the protected data area, and wherein said first area is the non-protected data area and the second area is the protected data area.

13. An external storage device connectable to a host computer, comprising:

a non-volatile semiconductor memory;

an interface to connect to the host computer; and a controller to access the non-volatile semiconductor memory in response to a command and an address from the host computer;

wherein said non-volatile semiconductor memory is divided into plural areas;

wherein a first command for accessing a first area among said plural areas of the non-volatile semiconductor memory is different from a second command for accessing a second area among said plural areas of the non-volatile semiconductor memory;

wherein the controller determines whether the command from the host computer is the first command or the second command, wherein, when the command is the first command, the controller carries out first command processing to a sector of the first area in accordance with the address from the host computer; and wherein, when the command is the second command, the controller carries out second command processing to a sector of the second area in accordance with the address from the host computer, further comprising:

a register which stores the address of the second area of the non-volatile semiconductor memory;

wherein, when the command from the host computer is the first command, the controller determines whether a sector to be accessed by the host computer is within the second area or not by comparing the address from the host computer with the address of the second area stored in the register and carries out the first command processing to a sector in the first area if the sector to be accessed by the host computer does not exist in the second area.

14. An external storage device connectable to a host computer, comprising:

a non-volatile semiconductor memory;

an interface to connect to the host computer; and a controller to access the non-volatile semiconductor memory in response to a command and an address from the host computer;

wherein said non-volatile semiconductor memory is adapted to be divided into plural areas;

wherein a first command for accessing a first area amond the plural areas of the non-volatile semiconductor memory is different form a second command for accessing a second area amond said plural areas of the non-volatile semiconductor memory;

wherein the controller determines whether a command from the host computer is the first command or the second command, wherein, when the command determined by the controller is the first command, the controller carries out first command processing to a sector of the first area in accordance wiht the address form the host computer; and wherein, when the command determined by the controller is the second command, the controller carries out second command processing to a sector of the second area in accordance with the address from the host computer, wherein the non-volatile semiconductor memory stores area information associated with the plural areas of the non-volatile semiconductor memory, wherein the external storage device changes sizes of the first and second areas of the non-volatile semiconductor memory and a border between the first area and the second area in response to a third command from the host computer by updating the area information stored in the non-volatile semiconductor memory to a new area information, wherein the third command is different form the first and second commands.

15. An external storage device according to claim 14, the plural areas comprising;

a user data area to store user data therein; and a management data area to store management data therein; wherein the user data area further comprises said first and second areas, and wherein said first area is a normal area and said second area is a protected area.

16. An external storage device according to claim 15, wherein:

the border is a start address of the protected area;

the management data area stores the area information including the sizes and the start address of the protected area when an address issued prior to the second command from the host computer coincides with the start address of the protected area in the area information within the management data area.

17. An external storage device according to claim 15, wherein;

the conroller carries out authentication of a user, and disables a protection function of the protected area when the authentication of the user is successful.

18. An external storage device according to claim 17, wherein:

the management data area stores a password of the user; and the controller carries out the authentication of the user by comparing a password from the host computer to the password stored in the management data area.

19. An external storage device according to claim 17, wherein:

the contoller carries out the authentication of the user when a command from the host computer is a protection disabling command for disabling the protection function of the protected area.

20. An external storage device according to claim 17, wherein:

the controller carries out authentication of the user when the external storage device is turned on.

21. An external storage device connectable to a host computer, comprising:

a non-volatile semiconductor memory;

an interface to connect to the host computer; and a controller to access the non-volatile semiconductor memory in response to a command and an address from the host computer;

wherein said non-volatile semiconductor memory is adapted to be divided into plural areas;

wherein a first command for accessing a first area amond said plural areas of the non-volatile semiconductor memory is different from a semiconductor memory is different from a second command for accessing a second area among said plural areas of the non-volatile semiconductor memory;

wherein the controller determines whether a command form the host computer is the first command or the second command, wherein, when the command determined by the controller is the first command, the controller carries out first command processing to a sector of the first area in accordance with the address from the host computer; and wherein, when the command determines by the controller is the second command, the controller carries out second command processing to a sector of the second area in accordance with the address from the host computer, wherein the first area is a non-protected data area, wherein the second area is a protected data area, wherein the non-volatile semiconductor memory stores information regarding the size and address of the proctected data area, wherein the controller changes the size and address of the protected data area of the non-volatile semiconductor memory in response to a third command from the host computer, wherein the third command is different from the first and second commands, and wherein, when the host computer accesses the protected data area, the external storage device performs an authentication procedure for accessing to the protected data area.

* * * * *